US008531215B2

(12) United States Patent
Morino

(10) Patent No.: US 8,531,215 B2
(45) Date of Patent: Sep. 10, 2013

(54) VOLTAGE DETECTOR

(75) Inventor: Koichi Morino, Kanagawa-ken (JP)

(73) Assignee: Ricoh Company, Ltd., Tokyo (JP)

( * ) Notice: Subject to any disclaimer, the term of this patent is extended or adjusted under 35 U.S.C. 154(b) by 489 days.

(21) Appl. No.: 12/943,592

(22) Filed: Nov. 10, 2010

(65) Prior Publication Data

US 2011/0121870 A1    May 26, 2011

(30) Foreign Application Priority Data

Nov. 20, 2009  (JP) ................................ 2009-264914

(51) Int. Cl.
*H03L 7/00*         (2006.01)

(52) U.S. Cl.
USPC ........................................................ 327/143

(58) Field of Classification Search
USPC ......................................... 327/142, 143, 198
See application file for complete search history.

(56) References Cited

U.S. PATENT DOCUMENTS 6,346,795 B2 *   2/2002   Haraguchi et al. ............ 320/136

FOREIGN PATENT DOCUMENTS

| JP | 62-90576 | 4/1987 |
|---|---|---|
| JP | 63-195267 | 12/1988 |
| JP | 2002-15568 | 1/2002 |
| JP | 2004-198335 | 7/2004 |
| JP | 2006-112889 | 4/2006 |
| JP | 2009-198476 | 9/2009 |

* cited by examiner

Primary Examiner — Daniel Rojas
(74) Attorney, Agent, or Firm — Cooper & Dunham LLP

(57) ABSTRACT

A voltage detector includes a first input terminal, a second input terminal, a first voltage detection circuit, a second voltage detection circuit, and a logic holder circuit. The first input terminal receives a first input voltage. The second input terminal receives a second input voltage. The first voltage detection circuit outputs a first detection signal that switches a logic state thereof when the first input voltage falls below a first detection voltage. The second voltage detection circuit outputs a second detection signal that switches a logic state thereof when the second input voltage falls below a second detection voltage. The logic holder circuit retains the logic state of the first detection signal when the second detection signal indicates that the second input voltage is below the second detection voltage.

16 Claims, 7 Drawing Sheets

VOLTAGE DETECTOR

BACKGROUND OF THE INVENTION

1. Technical Field

The present invention relates to a voltage detector for power supply voltage, and more particularly, to a voltage detector for use in power-on-reset (POR) circuitry that generates a reset signal to initialize circuit components upon detecting a power supply voltage rising to a given set point during power-up, which may be implemented on a semiconductor integrated circuit for incorporation into various electronic devices, such as mobile phones and laptop computers.

2. Description of the Background Art

Voltage detectors are employed in power-on-reset (POR) circuitry to generate a reset signal upon detecting a power supply voltage rising to a given set point during power-up, which initializes electrical components, such as flip-flops, latches, counters, registers, etc., forming a central processing unit (CPU) of the system. Typically, a POR circuit with voltage detection capabilities is implemented on a semiconductor integrated circuit for incorporation into various electronic devices, such as mobile phones and laptop computers.

FIG. 1 is a circuit diagram schematically illustrating a conventional voltage detector 104.

As shown in FIG. 1, the voltage detector 104 includes an input terminal to receive an input voltage VIN, a power supply terminal to receive a power supply voltage VDD1, and an output terminal to output an output signal DOUT, as well as a step-down voltage regulator 103, a voltage detection circuit 101, and output circuitry formed of a pair of first and second, constant current sources 115 and 117, a pair of first and second output transistors 116 and 118, each being an N-channel metal-oxide semiconductor (NMOS) device, and an inverter or logic NOT gate 131.

In the voltage detector 104, the step-down voltage regulator 103 is connected to the power supply terminal to convert the power supply voltage VDD1 into a lower, regulated supply voltage VDD2 for supply to the voltage detection circuit 101 and the output circuitry.

The voltage detection circuit 101 includes a set of voltage divider resistors 111 through 113 connected in series between the input terminal and ground to output a sense voltage VINS at a node between the resistors 111 and 112 proportional to the input voltage VIN, and an NMOS transistor switch 130 connected in parallel with the grounded resistor 113. Also included are a reference voltage generator 114 to generate a reference voltage Vref based on the power supply voltage VDD1, and a comparator 110 that receives the sense voltage VINS at an inverting input thereof and the reference voltage Vref at a non-inverting input thereof to generate a result of comparison between the input voltages VINS and Vref for output to the gate terminal of the transistor 116.

In the output circuit, the first constant current source 115 and the first output transistor 116 are connected in series between the supply voltage VDD2 and ground, with a node therebetween connected to the gate terminal of the transistor 118. The second constant current source 117 and the second output transistor 118 are connected in series between the supply voltage VDD2 and ground, with a node therebetween connected to the input terminal of the inverter 131. The output of the inverter 131 constitutes the output terminal of the voltage detector 104.

During operation, the voltage detector 104 outputs a reset signal or pulse DOUT when the input voltage VIN rises to a sufficient level for initialization during power-on, wherein the voltage detection circuit 101 monitors the input voltage VIN to cause the comparator 110 to switch its logic state whenever the input voltage VIN reaches a set point voltage Vdet, which is relatively high ("reset threshold Vdet+") where the voltage VIN rises from a lower level, and relatively low ("detection threshold Vdet−") where the voltage VIN falls from a higher level.

A problem encountered by the conventional voltage detector 104 is that it can incorrectly output a reset signal DOUT where the input voltage VIN does not reach the reset threshold Vdet+ during power-on. To illustrate the problem, consider a situation where the input voltage VIN rises to a level between the detection voltage Vdet− and the reset voltage Vdet+ prior to the power supply voltage VDD1 rising to a level sufficient to activate the detection circuit 101 powered with the regulated supply voltage VDD2.

In such cases, the voltage divider resistors 111 through 113 generate a sense voltage VINS from the input voltage VIN before the reference voltage generator 114 generates a reference voltage Vref from the supply voltage VDD1. The comparator 110, receiving the relatively high inverting input VINS and the relatively low non-inverting input Vref upon activation, outputs a logic low signal. The detection signal thus generated turns off the transistor 116 to in turn cause the transistor 118 to turn on and then the transistor 130 to turn off, resulting in the voltage detector 104 incorrectly outputting a reset pulse DOUT where the reset threshold Vdet+ has not been reached during power-on.

Hence, for proper operation of the voltage detector 104, the power supply voltage VDD1 for activating the comparator 110 is required to reach a specified level before the voltage divider circuit outputs the sense voltage VINS by dividing the input voltage VIN. Such requirement limits the availability of the voltage detector 104, making the conventional method less practical than otherwise expected.

To date, several other conventional methods have been proposed to provide an effective voltage detector for detecting a power supply voltage to generate a reset signal.

For example, one conventional method provides a voltage detector that detects an input voltage based on a hysteresis comparator provided with a reset threshold Vdet+ and a detection threshold Vdet−, the former being higher than the latter by a given threshold voltage. The hysteresis comparator is equipped with a hysteresis voltage controller that periodically reduces the hysteresis voltage during power-on, so as to enable the comparator to output a reset pulse when the input voltage exceeds the detection threshold Vdet− but does not yet reach the reset threshold Vdet+. Once the initial reset pulse is released, the hysteresis voltage controller returns the hysteresis voltage to the original level so that the comparator no longer outputs a reset pulse unless the reset threshold Vdet+ is reached.

According to this method, the voltage detector can generate a reset signal when the input voltage reaches the relatively low threshold Vdet− instead of the relatively high threshold Vdet+ during power-on. Such capability may be used to remove variability from a reset signal that can be occasionally released whether the input voltage reaches a detection threshold Vdet− or a reset threshold Vdet+ depending on the rising edge or other characteristics of the input voltage during power-on. However, the method can cause incoherence in the system and therefore is not reasonably practical, considering that a reset signal is required to indicate whenever the reset threshold Vdet+ is reached regardless of whether it is output during or after power-on, so as to serve its intended purposes.

Another conventional method provides a voltage detector that generates a primary detection signal upon detecting a power supply voltage falling below a given detection threshold through a primary detection circuit employing a bandgap reference (BGR) circuit for reference voltage generation. The BGR-based primary detection circuit is used in combination with a secondary detection circuit formed of a series circuit composed of a resistor and a MOS transistor, which retains the logic state of the primary detection signal upon detecting the power supply voltage falling below a setpoint voltage lower than the threshold voltage.

Such dual-detector circuitry is designed to address a problem encountered when using a BGR voltage in voltage detection, wherein the BGR circuit, when supplied with a low power supply voltage, outputs an unstable reference voltage which is repeatedly reached by a monitored voltage, resulting in unreliable operation of the BGR-based voltage detector. According to this method, provision of the secondary detection circuit periodically invalidates the primary detection circuit where the BGR circuit is unstable, thereby ensuring the voltage detector reliably operates with lower supply voltages.

Although effective for its intended purposes, the conventional voltage detector fails to work properly when used in high-voltage applications where a step-down voltage regulator renders a power supply voltage into a lower, regulated voltage. That is, the voltage detector can improperly switch its output signal as the secondary detection circuit detects the regulated power supply voltage transiently falling below the setpoint voltage due to variations in the power supply voltage even though the power supply voltage still remains above the threshold voltage.

BRIEF SUMMARY

This disclosure describes an improved voltage detector.

In one aspect of the disclosure, the improved voltage detector includes a first input terminal, a second input terminal, a first voltage detection circuit, a second voltage detection circuit, and a logic holder circuit. The first input terminal receives a first input voltage. The second input terminal receives a second input voltage. The first voltage detection circuit is connected to the first input terminal to output a first detection signal that switches a logic state thereof when the first input voltage falls below a first detection voltage. The second voltage detection circuit is connected to the second input terminal to output a second detection signal that switches a logic state thereof when the second input voltage falls below a second detection voltage. The second detection voltage is lower than the first detection voltage and higher than a minimum operating voltage of the first voltage detection circuit. The logic holder circuit has an input thereof connected to the second voltage detection circuit and an output thereof connected to the first voltage detection circuit to retain the logic state of the first detection signal when the second detection signal indicates that the second input voltage is below the second detection voltage.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF EXEMPLARY EMBODIMENTS

Figure 1:
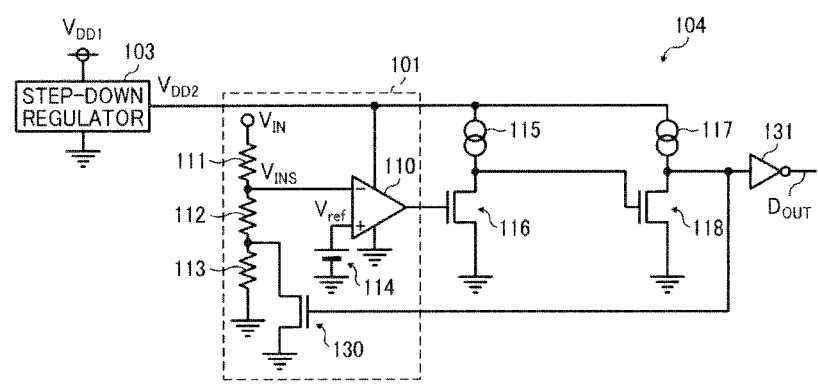
FIG. 1 is a circuit diagram schematically illustrating a conventional voltage detector.

In describing exemplary embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views, examples and exemplary embodiments of this disclosure are described.

Figure 2:
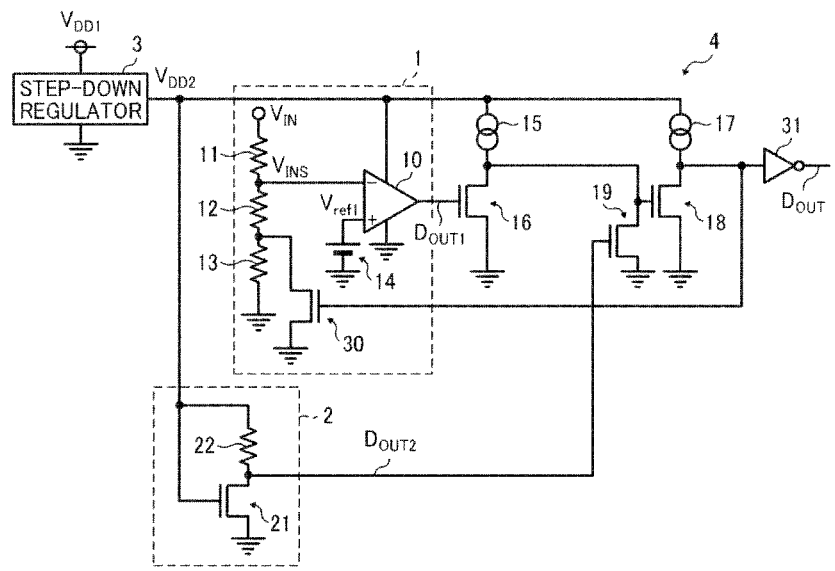
FIG. 2 is a circuit diagram schematically illustrating a voltage detector according to a first embodiment of this patent specification.

FIG. 2 is a circuit diagram schematically illustrating a voltage detector 4 according to a first embodiment of this patent specification.

As shown in FIG. 2, the voltage detector 4 includes a power supply terminal to receive a power supply voltage VDD1 from an external power source, an input terminal to receive an input voltage VIN from external circuitry, and an output terminal to transmit an output signal DOUT to external circuitry, as well as a step-down voltage regulator 3, a first voltage detection circuit 1, a second voltage detection circuit 2, and output circuitry formed of a pair of first and second, constant current sources 15 and 17, a pair of first and second, output transistors 16 and 18, a logic holder transistor 19, and an inverter or logic NOT gate 31.

The first voltage detection circuit 1 includes a comparator 10, a set of voltage divider resistors 11 through 13, and a switch transistor 30. The second voltage detection circuit 2 includes a detector transistor 21 and a resistor 22. The transistors recited herein are all N-channel metal-oxide-semiconductor (NMOS) devices each having a gate, source, and drain terminals.

All the components of the voltage detector 4 may be integrally formed on a single integrated circuit (IC) for incorporation into various electronic devices, such as mobile phones and laptop computers, in which case the input and output terminals may be coupled to external circuits located either inside or outside the IC on which the detector 4 is implemented.

In the voltage detector 4, the step-down voltage regulator 3 is connected to the power supply terminal to render the power supply voltage VDD1 into a lower, regulated voltage VDD2 for output to the first and second voltage detection circuits 1 and 2, and the output circuitry.

In the first voltage detector 1, the voltage divider resistors 11 through 13 are connected in series between the input terminal and ground to form a node between the resistors 11 and 12 to output a sense voltage VINS proportional to the input voltage VIN. The switch transistor 30 is connected in parallel with the grounded resistor 13. The reference voltage generator 14 generates a first reference voltage Vref1 based on the regulated supply voltage VDD2. The comparator 10 has an inverting input thereof connected to the node between the resistors 11 and 12 and a non-inverting input thereof connected to the output of the reference voltage generator 14 to compare the sense voltage VINS against the first reference voltage Vref1 so as to output a first detection signal DOUT1 at an output thereof.

In the second voltage detection circuit 2, the resistor 22 and the detector transistor 21 are connected in series between the regulator output and ground to form a voltage divider that outputs a second detection signal DOUT2 at an output node therebetween.

In the output circuitry, the first constant current source 15 and the first output transistor 16 are connected in series between the regulator output and ground, with a node therebetween connected to the gate terminal of the transistor 18. The second constant current source 17 and the second output transistor 18 are connected in series between the regulator output and ground, with a node therebetween connected to the gate terminal of the transistor 30 and the input of the inverter 31, respectively. The logic holder transistor 19 is connected between the gate of the transistor 18 and ground, with its gate terminal connected to the output of the second voltage detection circuit 2. The output of the inverter 31 constitutes the output terminal of the voltage detector 4.

During operation, the first voltage detection circuit 1 outputs the first detection signal DOUT1 at the output of the comparator 10 as a result of comparison between the sense voltage VINS and the reference voltage Vref1, which switches a logic state thereof when the input voltage VIN falls below a first detection voltage Vdet1.

The second voltage detection circuit 2 outputs the second detection signal DOUT2 at the node between the resistor 22 and the transistor 21, which switches a logic state thereof when the supply voltage VDD2 falls below a second detection voltage Vdet2.

The output circuitry generates the output signal DOUT according to the first and second detection signals DOUT1 and DOUT2, wherein the logic holder transistor 19 retains the logic state of the first detection signal DOUT1 when the second detection signal DOUT2 indicates that the voltage VDD2 is below the second detection voltage Vdet2.

The output signal DOUT thus obtained may act as a power-on-reset (POR) signal to indicate when the input voltage VIN rises to a reset voltage Vdet+ during power-on, according to which the system supplied with the voltage VIN can initialize or reset its circuit components, such as flip-flops, latches, counters, and various types of registers, forming a central processing unit (CPU).

Figure 3A:
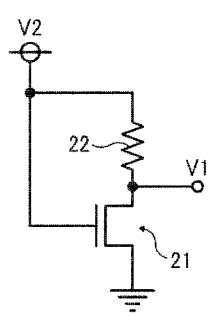
FIG. 3A is a circuit diagram of a second voltage detection circuit included in the voltage detector of FIG. 2.
Figure 3B:
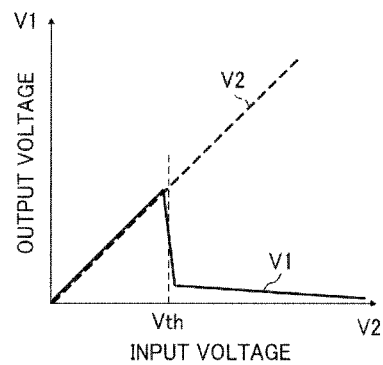
FIG. 3B is a graph showing a relation between input and output voltages of the second voltage detection circuit of FIG. 3A obtained through measurement.

FIG. 3A is a circuit diagram of the second voltage detection circuit 2 shown with its input terminal connected to a gradually increasing input voltage V2 to measure a resulting output voltage V1, and FIG. 3B is a graph showing a relation between the input and output voltages V1 and V2 of the second voltage detection circuit 2 obtained through measurement.

As shown in FIG. 3B, the output voltage V1 substantially equals the input voltage V2, as long as the input voltage V2 remains below a threshold voltage Vth of the NMOS transistor 21, causing the transistor 21 to shut off. When the input voltage V2 reaches the threshold voltage Vth to cause the transistor 21 to turn on, the output voltage V1 sharply declines to a level substantially lower than the input voltage V2. Thus, the second voltage detection circuit 2 outputs a logic high when the input voltage V2 is lower than the threshold voltage Vth, and a logic low when the input voltage V2 is higher than the threshold voltage Vth.

In the voltage detector 4, the second detection voltage Vdet2 is set to the threshold voltage Vth of the NMOS transistor 21. The NMOS transistor 21 is scaled so that the second detection voltage Vdet2 is lower than the first detection voltage Vdet1 and higher than a minimum operating voltage of the first voltage detection circuit 1. The second voltage detection circuit 2, formed of the series circuit composed of the resistor 22 and the transistor 21, can operate at voltages lower than those at which the first voltage detection circuit 1 operates. Accordingly, the second voltage detection circuit 2 starts operation before the first voltage detection circuit 1 is activated upon power-on, and switches its output DOUT2 after activation of the first voltage detection circuit 1.

Referring back to FIG. 2, now consider cases where the input voltage VIN rises to a certain operating voltage lower than the reset voltage Vdet+ upon power-on, before the power supply voltage VDD1 gradually increases to cause a corresponding increase in the regulated supply voltage VDD2.

In such cases, the second voltage detection circuit 2, which starts operation prior to activation of the first voltage detection circuit 1, initially outputs a logic high DOUT2 (the amplitude of which depends on the supply voltage VDD2) for input to the logic holder transistor 19. With the input signal DOUT2 being high, the NMOS transistor 19 conducts current to cause the NMOS transistor 18 to shut off.

With the transistor 18 being nonconductive, the voltage at the gate of the transistor 30 is high when the supply voltage VDD2 gradually increases to activate the first voltage detection circuit 1 as well as the constant current sources 15 and 17 of the output circuitry. This maintains the sense voltage VINS below the reference voltage Vref1 as the reference voltage generator 14 is completely activated. Then, the comparator 10, receiving the relatively low inverting input VINS and the relatively high non-inverting input Vref1, outputs a logic high DOUT1 to cause the NMOS transistor 16 to conduct. With the transistors 16 and 19 both remaining on, the transistor 18 remains off so that the inverter 31 outputs a logic low DOUT.

Then, after activation of the first voltage detection circuit 1, the supply voltage VDD2 rises to exceed the second detection voltage Vdet2. This causes the second voltage detection circuit 2 to switch its output DOUT2 from high to low, so that the transistor 19 shuts off. At this point, the output DOUT of the voltage detector 4 remains low as long as the transistor 16 remains conductive to keep the transistor 18 shut off.

Hence, the voltage detector 4 does not output an incorrect reset signal during power-on even where the input voltage VIN rises to an operating point prior to the power supply voltage VDD1, owing to the logic holder transistor 19 holding on the switch transistor 30 upon activation of the first voltage detection circuit 1 to retain the logic state of the first detection signal DOUT1. With this logic holding capability, the voltage detection circuit is not required to activate the comparator prior to the voltage divider outputting the voltage proportional to the monitored voltage, leading to broad practical applicability of the voltage detector 4 according to this patent specification.

Figure 4:
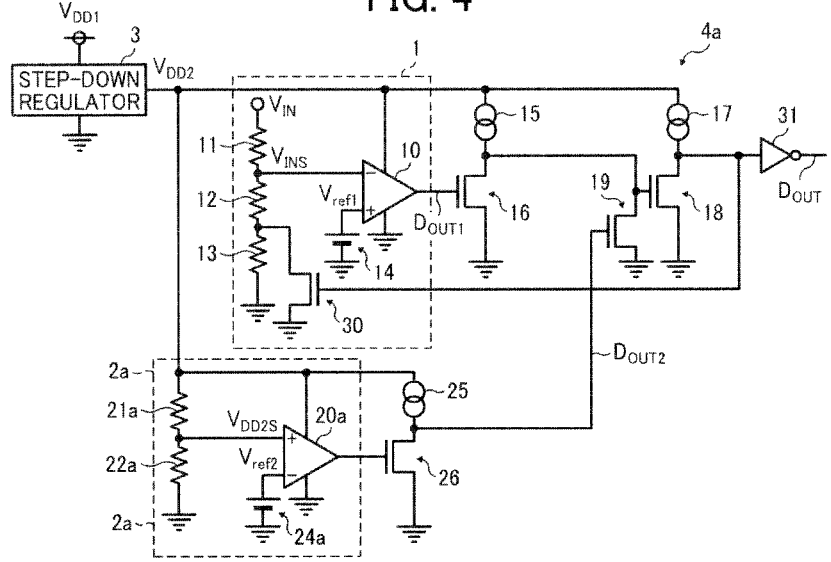
FIG. 4 is a circuit diagram schematically illustrating a voltage detector according to a second embodiment of this patent specification.

FIG. 4 is a circuit diagram schematically illustrating a voltage detector 4a according to a second embodiment of this patent specification.

As shown in FIG. 4, the overall configuration of the second embodiment is similar to that depicted in FIG. 2, except that the voltage detector 4a includes, in place of the series circuit composed of the resistor 22 and the transistor 21, a second voltage detection circuit 2a formed of a pair of voltage divider resistors 21a and 22a, a reference voltage generator 24a, and a comparator 20a, as well as a series circuit composed of a constant current source 25 and an NMOS transistor 26.

Specifically, in the second voltage detection circuit 2a, the resistors 21a and 22a are connected in series between the regulator output and ground to output a sense voltage VDD2S at a node therebetween proportional to the regulated supply voltage VDD2. The reference voltage generator 24a generates a second reference voltage Vref2. The comparator 20a has a non-inverting input thereof connected to the node between the resistors 21a and 22a, and an inverting input thereof connected to the reference voltage generator 24a to output a result of comparison between the input voltages VDD2S and Vref2 to the gate terminal of the transistor 26. The constant current source 25 and the transistor 26 are connected in series between the regulator output and ground to output a second detection signal DOUT2 at a node therebetween for input to the gate terminal of the transistor 19.

In such a configuration, the voltage detector 4a operates in a manner similar to that depicted primarily with reference to FIG. 2, wherein the second voltage detection circuit 2a provides the detection signal DOUT2 that causes the logic holder transistor 19 to hold on the switch transistor 30 upon activation of the first voltage detection circuit 1.

Figure 5:
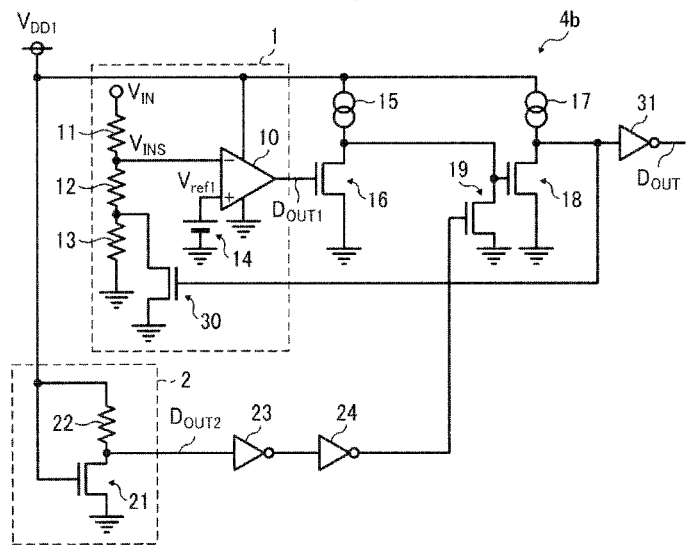
FIG. 5 is a circuit diagram schematically illustrating a voltage detector according to a third embodiment of this patent specification.

FIG. 5 is a circuit diagram schematically illustrating a voltage detector 4b according to a third embodiment of this patent specification.

As shown in FIG. 5, the overall configuration of the third embodiment is similar to that depicted in FIG. 2, except that the voltage detector 4b has no step-down voltage regulator 3 to generate the lower regulated voltage VDD2, so that the first and second voltage detection circuits 1 and 2 and the output circuitry operate with the power supply voltage VDD1 supplied from an external power source.

In such a configuration, the voltage detector 4b operates in a manner similar to that depicted primarily with reference to FIG. 2, wherein the second voltage detection circuit 2 provides the detection signal DOUT2, which, in this embodiment after modification through a series circuit composed of a pair of inverters 23 and 24, causes the logic holder transistor 19 to hold on the switch transistor 30 upon activation of the first voltage detection circuit 1.

Figure 6:
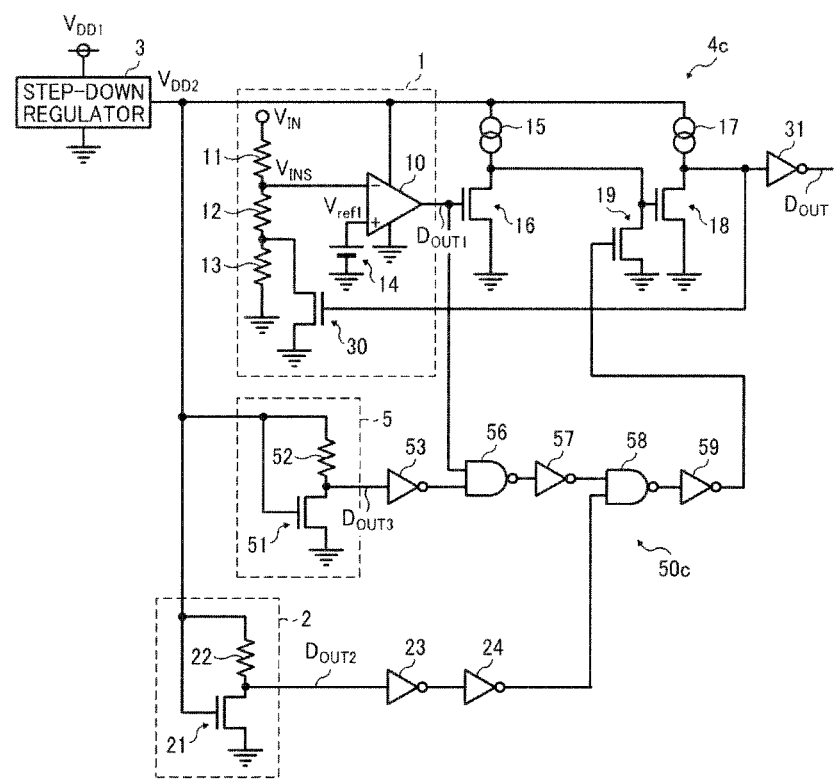
FIG. 6 is a circuit diagram schematically illustrating a voltage detector according to a fourth embodiment of this patent specification.

FIG. 6 is a circuit diagram schematically illustrating a voltage detector 4c according to a fourth embodiment of this patent specification.

As shown in FIG. 6, the overall configuration of the fourth embodiment is similar to that depicted in FIG. 2, except that the voltage detector 4c includes a third voltage detection circuit 5 as well as a set of inverters 23, 24, 53, 57, and 59, and a pair of logic NAND gates 56 and 58, which together form a control circuit 50c connected between the second voltage detection circuit 2 and the logic holder transistor 19.

Specifically, in the control circuit 50c, the third voltage detection circuit 5 is formed of a resistor 52 and a switch transistor 51 connected in series between the regulator output and ground to output a third detection signal DOUT3 at a node therebetween. The NAND gate 56 has one input connected to the output of the third voltage detection circuit 5 through the inverter 53, and the other input connected to the output of the first voltage detection circuit 1. The NAND gate 58 has one input connected to the output of the NAND gate 56 through the inverter 57, and the other input connected to the output of the second voltage detection circuit 2 through the inverters 23 and 24 connected in series. The output of the NAND gate 58 is connected to the gate terminal of the logic holder transistor 19 through the inverter 59.

The third voltage detection circuit 5 operates in a manner similar to that of the second voltage detection circuit 2, with its detection and reset threshold voltages both equal to or greater than the minimum operating voltage of the first voltage detection circuit 1 and equal to or smaller than the second detection voltage Vdet2.

In such a configuration, the control circuit 50c enables the logic holder transistor 19 by validating the second detection signal DOUT2 when the power supply voltage remains below the minimum operating voltage of the first voltage detection circuit 1, and disables the logic holder transistor 19 by invalidating the second detection signal DOUT2 when the first detection signal DOUT1 indicates that the input voltage VIN reaches the first detection voltage Vdet1 to assert a reset signal.

Such control circuit 50c serves to prevent the second detection signal DOUT2 from acting on the logic holder transistor 19 where the first voltage detection circuit 1 operates in a detection mode, i.e., during a period of time between when the input voltage VIN rises to an operating voltage and when the power supply voltage VDD1 rises to the minimum operating voltage of the voltage detector 4. This arrangement prevents the voltage detector 4 from incorrectly deasserting a reset signal where the supply voltage VDD2 transiently falls below the second detection voltage Vdet2 due to variations in the power supply voltage VDD1 supplied from an external power source.

Figure 7:
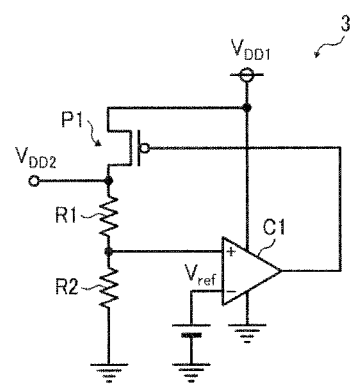
FIG. 7 is a circuit diagram schematically illustrating an example of a step-down voltage regulator for use in the voltage detector of FIG. 6.

FIG. 7 is a circuit diagram schematically illustrating an example of the step-down voltage regulator 3 for generating the supply voltage VDD2.

As shown in FIG. 7, the regulator 7 may be configured as a simple linear regulator, consisting of an output, P-channel metal-oxide semiconductor (PMOS) transistor P1 connected between the regulator input and output terminals; a pair of resistors R1 and R2 connected between the output terminal and ground; a reference voltage generator generating a reference voltage Vref; and a comparator C1 having a non-inverting input thereof connected to a node between the resistors R1 and R2, an inverting input thereof connected to the reference voltage output, and an output thereof connected to the gate terminal of the output transistor P1.

During operation, the step-down voltage regulator 3 converts an input voltage VDD1 input to the input terminal to an output voltage VDD2 for output to the output terminal by regulating current flow through the output transistor P1. Such voltage regulation is well known in the art, a further description of which is omitted for brevity.

Figure 8:
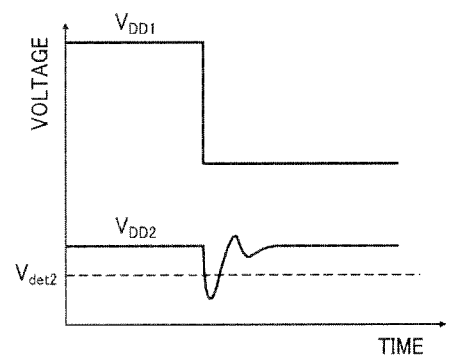
FIG. 8 is a time chart showing input and output voltages of the voltage regulator of FIG. 7.

FIG. 8 is a time chart showing the input and output voltages VDD1 and VDD2 of the voltage regulator 3 depicted above, in which the input voltage VDD1 varies due to external factors outside the detector circuitry.

As shown in FIG. 8, the input voltage VDD1 sharply declines to cause a corresponding variation in the output voltage VDD2. This causes the output voltage VDD2 to transiently fall below the second detection voltage Vdet2 even where the input voltage VDD1 remains above the first detection voltage Vdet1.

If not corrected, the transient variation in the supply voltage VDD2 would cause the transistor 19 to turn on to incorrectly deassert a reset signal where the power supply voltage VDD1 is above the first detection voltage Vdet1. In the voltage detector 4c, such failure upon variations in the power supply voltage VDD1 is prevented by the control circuit 50c, which disables the logic holder transistor 19 when the first detection circuit 1 asserts a reset signal. Provision of the control circuit 50c thus ensures the voltage detector 4 properly operates in high-voltage applications that involve step-down voltage regulation.

Figure 9:
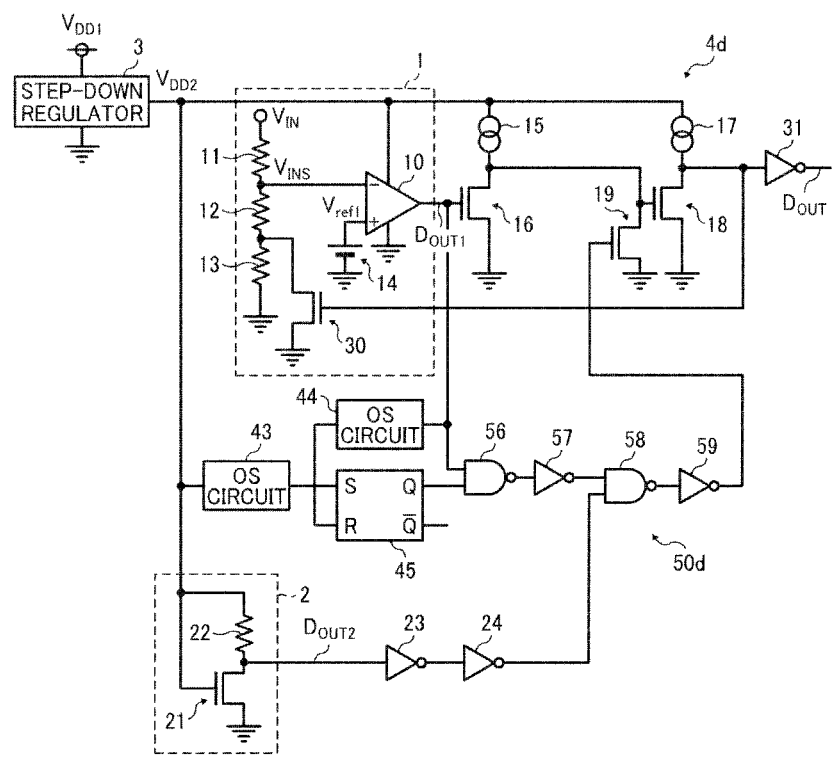
FIG. 9 is a circuit diagram schematically illustrating a voltage detector according to a fifth embodiment of this patent specification.

FIG. 9 is a circuit diagram schematically illustrating a voltage detector 4d according to a fifth embodiment of this patent specification.

As shown in FIG. 9, the overall configuration of the fifth embodiment is similar to that depicted in FIG. 2, except that the voltage detector 4d includes a pair of first and second one-shot (OS) generators 43 and 44 and an RS flip-flop (RS-FF) 45, as well as inverters 23, 24, 57, and 59, and a pair of logic NAND gates 56 and 58, which together form a control circuit 50d connected between the second voltage detection circuit 2 and the logic holder transistor 19.

Specifically, in the control circuit 50d, the first OS generator 43 has an input connected to the voltage VDD2 and an output connected to an S input of the RS-FF 45. The second OS generator 44 has an input connected to the output of the first voltage detection circuit 1 and an output connected to an R input of the RS-FF 45. The NAND gate 56 has one input connected to a Q output of the RE-FF 45, and the other input connected to the output of the first voltage detection circuit 1. The NAND gate 58 has one input connected to the output of the NAND gate 56 through the inverter 57, and the other input connected to the output of the second voltage detection circuit 2 through the inverters 23 and 24 connected in series. The output of the NAND gate 58 is connected to the gate terminal of the logic holder transistor 19 through the inverter 59.

During operation, the first OS generator 43 generates a single electrical pulse for input to the RS-FF 45 as the supply voltage VDD2 rises to an operating voltage. The second OS generator 44 generates a single electrical pulse for input to the RS-FF 45 when the output of the first voltage detection circuit 1 goes from high to low to assert a reset signal.

In such a configuration, the control circuit 50d initially enables the logic holder transistor 19 by validating the second detection signal DOUT2 until the power supply voltage exceeds the minimum operating voltage of the first voltage detection circuit 1, and to subsequently disable the logic holder transistor 19 by invalidating the second detection signal DOUT2 once the first detection signal DOUT1 indicates that the input voltage VIN reaches the first detection voltage Vdet1 to assert a reset signal.

Such control circuit 50d serves to prevent the second detection signal DOUT2 from acting on the logic holder transistor 19 once the first detection circuit 1 initially switches its output signal DOUT1 after the power supply voltage VDD2 rises to the operating voltage. This arrangement prevents the voltage detector 4 from incorrectly deasserting a reset signal where the supply voltage VDD2 transiently falls below the second detection voltage Vdet2 due to variations in the power supply voltage VDD1 supplied from an external power source.

Figure 10:
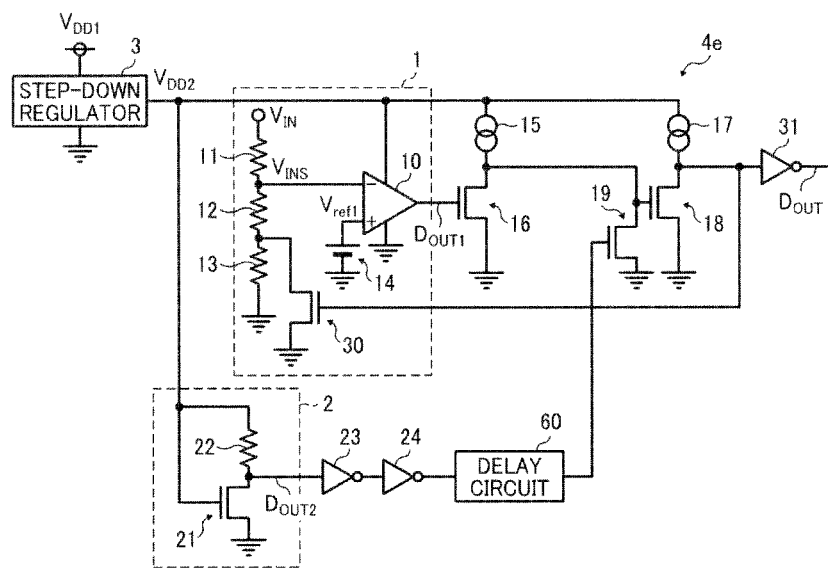
FIG. 10 is a circuit diagram schematically illustrating a voltage detector according to a sixth embodiment of this patent specification.

FIG. 10 is a circuit diagram schematically illustrating a voltage detector 4e according to a sixth embodiment of this patent specification.

As shown in FIG. 10, the overall configuration of the sixth embodiment is similar to that depicted in FIG. 2, except that the voltage detector 4e includes a pair of inverters 23 and 24, and a delay circuit 60 connected in series between the output of the second voltage detection circuit 2 and the gate terminal of the logic holder transistor 19.

Figure 11:
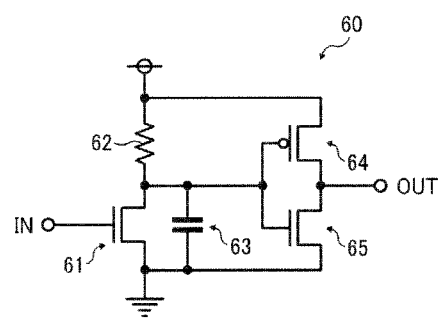
FIG. 11 is a circuit diagram schematically illustrating an example of a delay circuit used in the voltage detector of FIG. 10.

With additional reference to FIG. 11, which is a circuit diagram schematically illustrating an example of the delay circuit 60 used in the voltage detector 4e, the delay circuit 60 is shown consisting of an NMOS transistor 61 and a resistor 62 connected in series between the power supply voltage and ground, a capacitor 63 connected in parallel with the transistor 61, and a PMOS transistor 64 and an NMOS transistor 65 connected in series between the power supply voltage and ground, with their common drain connected to a drain terminal of the transistor 61. The delay circuit 60 has its input IN connected to the gate terminal of the transistor 61, and its output OUT connected to the node between the transistors 64 and 65.

In such a configuration, the delay circuit 60 provides a delay time between when the second detection signal DOUT2 switches the logic state thereof and when the logic holder transistor 19 retains the logic state of the first detection signal DOUT1.

Such delay circuit 60 serves to prevent the second detection signal DOUT2 from acting on the logic holder transistor 19 where the supply voltage VDD2 periodically falls below the second detection voltage Vdet2 to cause the second voltage detection circuit 2 to switch its output signal DOUT2, but immediately resumes its original level within the delay time provided by the delay circuit 60. This arrangement prevents the voltage detector 4 from incorrectly deasserting a reset signal where the supply voltage VDD2 transiently falls below the second detection voltage Vdet2 due to variations in the power supply voltage VDD1 supplied from an external power source.

Numerous additional modifications and variations are possible in light of the above teachings. It is therefore to be understood that within the scope of the appended claims, the disclosure of this patent specification may be practiced otherwise than as specifically described herein.

This patent specification is based on Japanese patent application No. 2009-264914 filed on Nov. 20, 2009 in the Japanese Patent Office, the entire contents of which are hereby incorporated by reference herein.

What is claimed is:
1. A voltage detector comprising:
a first input terminal to receive a first input voltage;
a second input terminal to receive a second input voltage;
a first voltage detection circuit connected to the first input terminal to output a first detection signal that switches a logic state thereof when the first input voltage falls below a first detection voltage;
a second voltage detection circuit connected to the second input terminal to output a second detection signal that switches a logic state thereof when the second input voltage falls below a second detection voltage,
the second detection voltage being lower than the first detection voltage and higher than a minimum operating voltage of the first voltage detection circuit; and
a logic holder circuit having an input thereof connected to the second voltage detection circuit and an output thereof connected to the first voltage detection circuit to retain the logic state of the first detection signal when the second detection signal indicates that the second input voltage is below the second detection voltage.

2. The voltage detector according to claim 1, further comprising a control circuit connected between the second voltage detection circuit and the logic holder circuit to enable the logic holder circuit by validating the second detection signal when the second input voltage remains below the minimum operating voltage of the first voltage detection circuit, and to disable the logic holder circuit by invalidating the second detection signal when the first detection signal indicates that the first input voltage reaches the first detection voltage to assert a reset signal.

3. The voltage detector according to claim 2, wherein the control circuit comprises:
  a third voltage detection circuit connected to the second input terminal to output a third detection signal that switches a logic state thereof when the second input voltage falls below a third detection voltage; and
  a logic circuit connected to the outputs of the first through third voltage detection circuits to control the second detection signal according to the first and third detection signals.

4. The voltage detector according to claim 1, wherein the voltage detector enables the logic holder circuit by validating the second detection signal when the second input voltage remains below the minimum operating voltage of the first voltage detection circuit, and disables the logic holder circuit by invalidating the second detection signal when the first detection signal indicates that the first input voltage reaches the first detection voltage to assert a reset signal.

5. The voltage detector according to claim 1, further comprising a control circuit connected between the second voltage detection circuit and the logic holder circuit to initially enable the logic holder circuit by validating the second detection signal until the second input voltage exceeds the minimum operating voltage of the first voltage detection circuit, and to subsequently disable the logic holder circuit by invalidating the second detection signal once the first detection signal indicates that the first input voltage reaches the first detection voltage to assert a reset signal.

6. The voltage detector according to claim 5, wherein the control circuit comprises:
  an RS flip-flop;
  a first one-shot pulse generator connected to the second input terminal to generate an electrical pulse for input to the RS flip-flop as the second input voltage rises to an operating voltage;
  a second one-shot pulse generator connected to the output of the first voltage detection circuit to generate an electrical pulse for input to the RS flip-flop when the first detection signal switches to assert a reset signal; and
  a logic circuit connected to the outputs of the first and second voltage detection circuits and the RS flip-flop to control the second detection signal according to an output of the RS flip-flop and the first detection signal.

7. The voltage detector according to claim 1, wherein the voltage detector initially enables the logic holder circuit by validating the second detection signal until the second input voltage exceeds the minimum operating voltage of the first voltage detection circuit, and subsequently disables the logic holder circuit by invalidating the second detection signal once the first detection signal indicates that the first input voltage reaches the first detection voltage to assert a reset signal.

8. The voltage detector according to claim 1, further comprising a delay circuit connected between the second voltage detection circuit and the logic holder circuit to provide a delay time between when the second detection signal switches the logic state thereof and when the logic holder circuit retains the logic state of the first detection signal.

9. The voltage detector according to claim 1, wherein the voltage detector exhibits a delay time between when the second detection signal switches the logic state thereof and when the logic holder circuit retains the logic state of the first detection signal.

10. The voltage detector according to claim 1, further comprising a step-down voltage regulator that converts a power supply voltage into a lower constant voltage for supply to the first and second voltage detection circuits,
  wherein the voltage detector is integrated into a single integrated circuit powered with the power supply voltage.

11. The voltage detector according to claim 10, further comprising a control circuit connected between the second voltage detection circuit and the logic holder circuit to enable the logic holder circuit by validating the second detection signal when the power supply voltage remains below the minimum operating voltage of the first voltage detection circuit, and to disable the logic holder circuit by invalidating the second detection signal when the first detection signal indicates that the first input voltage reaches the first detection voltage to assert a reset signal.

12. The voltage detector according to claim 11, wherein the control circuit comprises:
  a third voltage detection circuit connected to the second input terminal to output a third detection signal that switches a logic state thereof when the second input voltage falls below a third detection voltage; and
  a logic circuit connected to the outputs of the first through third voltage detection circuits to control the second detection signal according to the first and third detection signals.

13. The voltage detector according to claim 10, wherein the voltage detector enables the logic holder circuit by validating the second detection signal when the power supply voltage remains below the minimum operating voltage of the first voltage detection circuit, and disables the logic holder circuit by invalidating the second detection signal when the first detection signal indicates that the first input voltage reaches the first detection voltage to assert a reset signal.

14. The voltage detector according to claim 10, further comprising a control circuit connected between the second voltage detection circuit and the logic holder circuit to initially enable the logic holder circuit by validating the second detection signal until the power supply voltage exceeds the minimum operating voltage of the first voltage detection circuit, and to subsequently disable the logic holder circuit by invalidating the second detection signal once the first detection signal indicates that the first input voltage reaches the first detection voltage to assert a reset signal.

15. The voltage detector according to claim 14, wherein the control circuit comprises:
  an RS flip-flop;
  a first one-shot pulse generator connected to the second input terminal to generate an electrical pulse for input to the RS flip-flop as the second input voltage rises to an operating voltage;
  a second one-shot pulse generator connected to the output of the first voltage detection circuit to generate an electrical pulse for input to the RS flip-flop when the first detection signal switches to assert a reset signal; and
  a logic circuit connected to the outputs of the first and second voltage detection circuits and the RS flip-flop to control the second detection signal according to an output of the RS flip-flop and the first detection signal.

16. The voltage detector according to claim 10, wherein the voltage detector initially enables the logic holder circuit by validating the second detection signal until the power supply voltage exceeds the minimum operating voltage of the first voltage detection circuit, and subsequently disables the logic holder circuit by invalidating the second detection signal once the first detection signal indicates that the first input voltage reaches the first detection voltage to assert a reset signal.

* * * * *